(12) United States Patent
Pan

(10) Patent No.: US 9,517,494 B2
(45) Date of Patent: Dec. 13, 2016

(54) METHOD AND SYSTEM FOR CLEANING PHOTOMASKS

(71) Applicant: GUDENG PRECISION INDUSTRIAL CO, LTD., New Taipei (TW)

(72) Inventor: Yung-Chin Pan, New Taipei (TW)

(73) Assignee: GUDENG PRECISION INDUSTRIAL CO, LTD., New Taipei (TW)

( * ) Notice: Subject to any disclaimer, the term of this patent is extended or adjusted under 35 U.S.C. 154(b) by 506 days.

(21) Appl. No.: 13/762,499

(22) Filed: Feb. 8, 2013

(65) Prior Publication Data

US 2014/0137890 A1    May 22, 2014

(30) Foreign Application Priority Data

Nov. 19, 2012 (TW) .............................. 101143121 A

(51) Int. Cl.
| | | |
|---|---|---|
| B08B 7/00 | (2006.01) | |
| B08B 1/02 | (2006.01) | |
| B08B 3/00 | (2006.01) | |
| B08B 3/10 | (2006.01) | |
| B08B 1/00 | (2006.01) | |
| G03F 1/82 | (2012.01) | |

(52) U.S. Cl.
CPC . B08B 3/10 (2013.01); B08B 1/00 (2013.01); G03F 1/82 (2013.01)

(58) Field of Classification Search
None
See application file for complete search history.

(56) References Cited

U.S. PATENT DOCUMENTS

| 6,432,212 B1 * | 8/2002 | Hirose | B08B 1/007 134/33 |
|---|---|---|---|
| 2001/0010103 A1 * | 8/2001 | Konishi | B08B 1/04 15/77 |
| 2002/0189641 A1 * | 12/2002 | Sato | B08B 1/04 134/6 |
| 2009/0193601 A1 * | 8/2009 | Tan et al. | 15/160 |
| 2009/0202951 A1 * | 8/2009 | Yamamoto et al. | 430/322 |

FOREIGN PATENT DOCUMENTS

JP    07169732    *    7/1995    ........... H01L 21/304

OTHER PUBLICATIONS

JP07-169732 English Translation, accessed on Jun. 2015.*

* cited by examiner

*Primary Examiner* — Eric Golightly
*Assistant Examiner* — Arlyn I Rivera-Cordero
(74) *Attorney, Agent, or Firm* — Li & Cai Intellectual Property (USA) Office

(57) ABSTRACT

A method for cleaning photomasks includes the following steps: provided a cleansing device having a scrubbing unit. The scrubbing unit having a saturated scrubbing surface is use to clean photomasks with the obliquely dispensed fluids. In such a fashion, loosened contaminants are removed. As least one oblique surface is formed on the peripheries of the scrubbing surface to form a channeling region such that fluids can instantly flow away from photomasks after cleaning to prevent re-contamination. The instant disclosure also provides a system for cleaning photomasks.

7 Claims, 8 Drawing Sheets

METHOD AND SYSTEM FOR CLEANING PHOTOMASKS

BACKGROUND OF THE INVENTION

1. Field of the Invention

The instant disclosure relates to a photomask cleaning method and system; in particular, to a photomask cleaning method and system that cleans photomasks through rinsing and wiping.

2. Description of Related Art

IC chip is composed of highly precise integrated circuits, in which the manufacturing process requires the use of high precision machines on silicon wafer for high precision lamination in a clean room environment. The manufacturing cost for the associated machine and fabrication plant is high. Thus, in silicon wafer manufacturing process, product yield rate can determine if a semiconductor factory profits or not. Therefore, improving product yield is the one of the most important factor in the minds of every semiconductor factory owner.

One of the major factors that affects yield rate of wafers is the cleanliness of the photomask. If contaminated photomasks are used to produce semiconductors during photolithography process, corresponding defects can develop on the wafer. In order to keep the photomask clean, photomasks are usually setup with a photomask protective film (Pellicle) to prevent dust particles from attaching to the mask. Since the photomask protective film is kept a certain distance away from the photomask through a frame structure, dust particles may collect on the photomask protective film such that focusing issues during development can be prevented.

It is a common practice that, prior to photomask shipment or micro-film processing, a scan is conducted to confirm that the pattern on the photomask is accurate. If flaws are identified, they must be removed or the photomask protective film must be scrapped off the photomask, and then immersed into an acid bath for cleaning. For cleaning solutions, sulfuric acid along with hydrogen peroxide solution ($H_2SO_4/H_2O_2$, SPM), and the aqueous solution of ammonium hydroxide along with hydrogen peroxide (SCL) solution are commonly used. Sulfuric acid and hydrogen peroxide solution are used to remove large organic molecules while ammonium hydroxide and hydrogen peroxide aqueous solution are used to remove small organic molecules and particles. Successively, deionized water (DI water) is used to remove residual cleaning solution to complete the cleaning process. Thereafter, a new photomask protective film is disposed onto the photomask. However, the photomask protective film is quite expensive, thus scraping sheets of protective films will significantly increase the costs of photomasks application. Furthermore, the adhesive on the common photomask protective film is generally composed of ester structure (RCOOR) x such as poly-acrylic ester structure. Thus, when photomasks are immersed into a bath of sulfuric acid and hydrogen peroxide solution, (RCOOR) x will hydrolyze into a colloidal state of (RCOOH) x which may cause defects on the photomask pattern and lead to scrapping. In fact, each photomask can only be used to clean three times before scrapping while the price of photomasks can be as high as hundreds of thousands of dollars up to 2 million dollars, and rendering the cost of photomask application high.

To improve upon from the conventional method, one possible method to improve photomask cleanliness is to clamp and move the photomask towards cleaning and drying equipment for cleaning and drying.

To address the above issues, the inventor strives via associated experience and research to present the instant disclosure, which can effectively improve the limitation described above.

SUMMARY OF THE INVENTION

The instant disclosure provides a method for cleaning photomasks which allows the cleaning liquid to effectively and quickly divert away from photomasks and prevent re-contamination from backwashed fluids.

Specifically, the instant disclosure provides a photomask cleaning system. The photomask includes a target surface to be cleaned. The photomask cleaning system comprises a retaining device for retaining the photomask, a cleansing device, an elevating platform, and a drying device. The cleansing device is arranged towards the target surface and includes a fluid dispensing unit, a scrubbing unit, a cover, a fixing unit and a stage. The fluid dispensing unit includes a direct dispenser and at least one oblique dispenser disposed proximate to the fluid dispensing unit and obliquely dispenses fluid onto the target surface for cleaning. The cover is disposed on the peripheries of the direct dispenser in order to secure the scrubbing unit thereon. The fixing unit secures the cover onto the fluid dispensing unit. The stage includes at least one fluid supplying conduit and a retaining plate. One end of the fluid supplying conduit pipe is connected to the retaining plate while the retaining plate is disposed on a side of the fluid dispensing unit opposite to the photomask. The aforementioned elevating platform is disposed on a side of the cleansing device opposite of the photomask for adjusting the corresponding positioning of the cleansing device and photomask. The drying device is arranged towards the target surface and proximate to the cleansing device. The instant disclosure obliquely dispenses fluid onto the area which requires scrubbing for facilitating water flow to divert away loosened contaminants.

The instant disclosure also provides a photomask cleaning method in which the photomask includes a target surface. The method includes the following steps: providing a cleansing device including a scrubbing unit, positioning a photomask to arrange a target surface towards the scrubbing unit, forming a pre-pressed state between the scrubbing unit and the photomask such that the scrubbing unit makes contact with the photomask at a predetermined pressure, cleaning the target surface of the photomask with a moist and partially exposed scrubbing surface of the scrubbing unit, dispensing fluids obliquely towards the target surface to remove loosen contaminants via the cleansing device so as to establish a non-orthogonal angle between the target surface and the fluid dispensing towards the photomask, forming at least one oblique surface proximate to the periphery of the scrubbing surface such that the oblique surface arranged towards the obliquely dispensed fluids forms a channeling region for channeling away fluids after cleaning from the photomask, draining the collected fluids after cleaning, and positioning the photomask to a drying area for blow drying. The instant disclosure facilitates fluids after cleaning to quickly divert away from the photomask and prevent re-contamination from backwashed fluids.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

Figure 1:
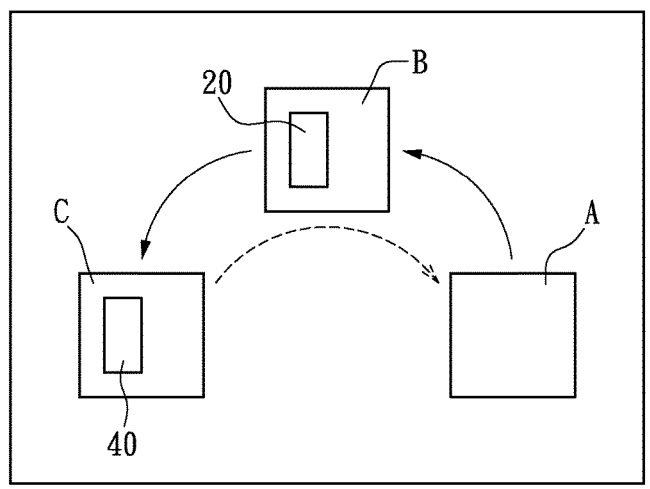
FIG. 1 is a schematic diagram of the photomask cleaning system according to the instant disclosure.
Figure 2:
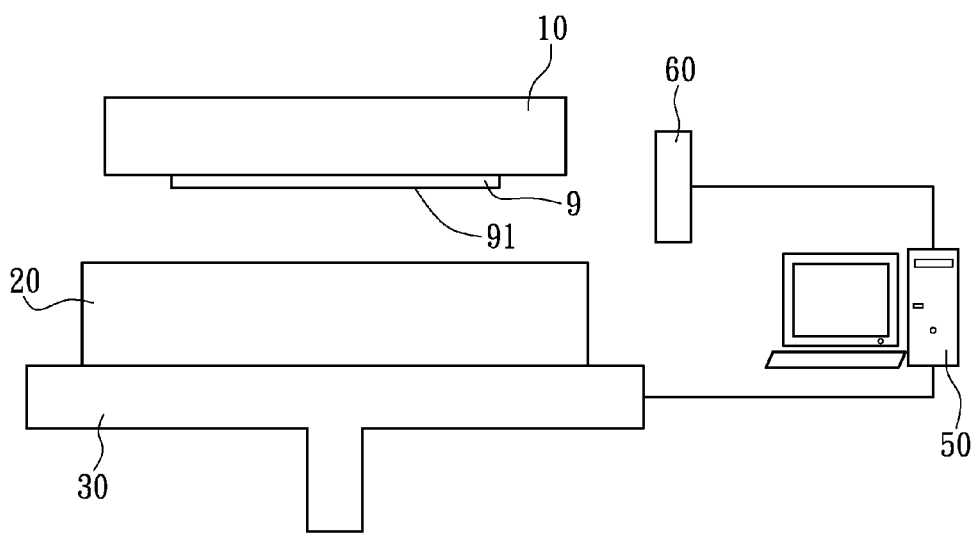
FIG. 2 is a schematic diagram of the photomask cleaning system illustrating the cleansing device according to the instant disclosure.

Referring to FIGS. 1 and 2 as the schematic diagram of a cleaning system and a cleansing device thereof, respectively, in accordance to the instant disclosure. The instant disclosure provides a photomask cleaning system 1 for cleaning a photomask 9 which includes a retaining device 10, a cleansing device 20, an elevating platform, a drying device 40, a processing unit 50, and a sensor element 60. The photomask 9 includes a target surface 91 which may contain buildups of contaminants such as chemical residue, particles, dust, atomized particles or the like. The retaining device 10 retains the photomask 9 such that the target surface 91 faces towards the cleansing device 20 and the drying device 40. The elevating platform 30 is arranged on a side of the cleansing device 20 which is opposite from the photomask 9 such that the sensor element 60 can sense the corresponding positioning of the cleansing device 20 and photomask 9, and transfer the positioning data to the processing unit 50 for assessment. As a result, the processing unit 50 controls the height of the elevating platform 30 by determining and adjusting the corresponding positioning of the cleansing device 20 and the photomask 9.

As illustrated in the instant embodiment according to FIGS. 1 and 2, the photomask 9 of the photomask cleaning system 1 is disposed in a receiving area A and retained by the retaining device 10. The retaining device 10 then positions the photomask 9 to a rinsing area B, and arranges the target surface 91 towards the cleansing device 20 which is located in the rinsing area B. Height of the cleansing device 20 is adjusted through the elevating platform 30 such that the cleansing device 20 and the photomask 9 are mutually abutted. Once the cleaning is complete, the photomask 9 is positioned to a drying area C containing the drying device 40 and arranged to face the drying device 40 for drying the target surface 91. Thereafter, positioning and depositing the photomask 9 back to the receiving area A.

Figure 3:
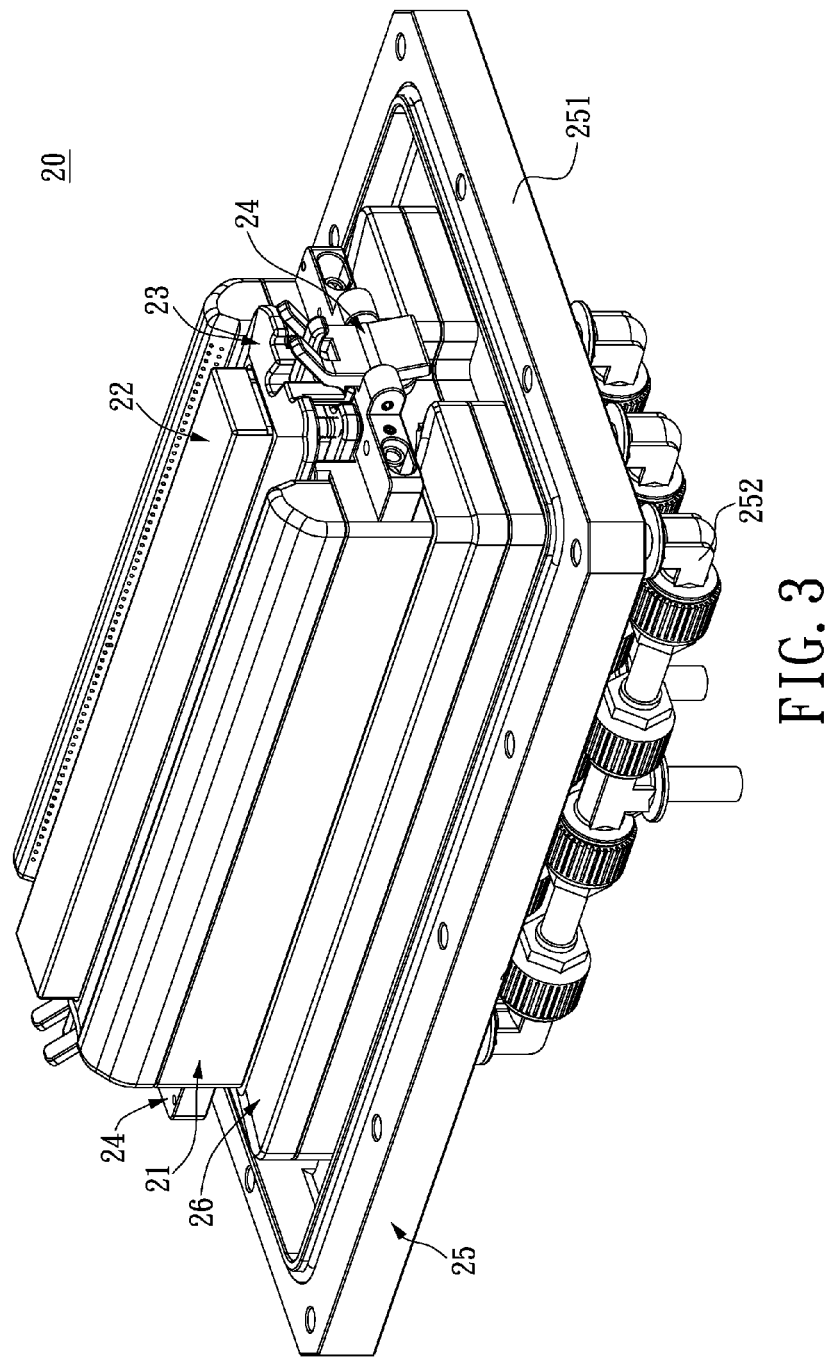
FIG. 3 is a schematic diagram of the assembled photomask cleaning system illustrating the cleansing device according to the instant disclosure.

Referring to FIG. 3 is the assembled schematic diagram of the cleaning system. The cleansing device 20 includes a stage 25, a fluid dispensing unit 21 disposed above the stage 25, a guiding base 26 disposed between the fluid dispensing unit 21 and the stage 25, a scrubbing unit 22 disposed above the fluid dispensing unit 21, a cover 23 which secures the scrubbing unit 22 onto the fluid dispensing unit 21, and a fixing unit 24 which couples the cover 23 and the fluid dispensing unit 21.

As illustrated in FIG. 2, when cleaning the photomask 9, the photomask 9 is retained above the cleansing device 20 while the target surface 91 faces the cleansing device 20 to facilitate loosening contaminants on the photomask 9 and allowing water flow to remove contaminants. The water flow aforementioned is not limited to water, as cleaning fluids for cleaning photomask may also be applied.

Figure 4:
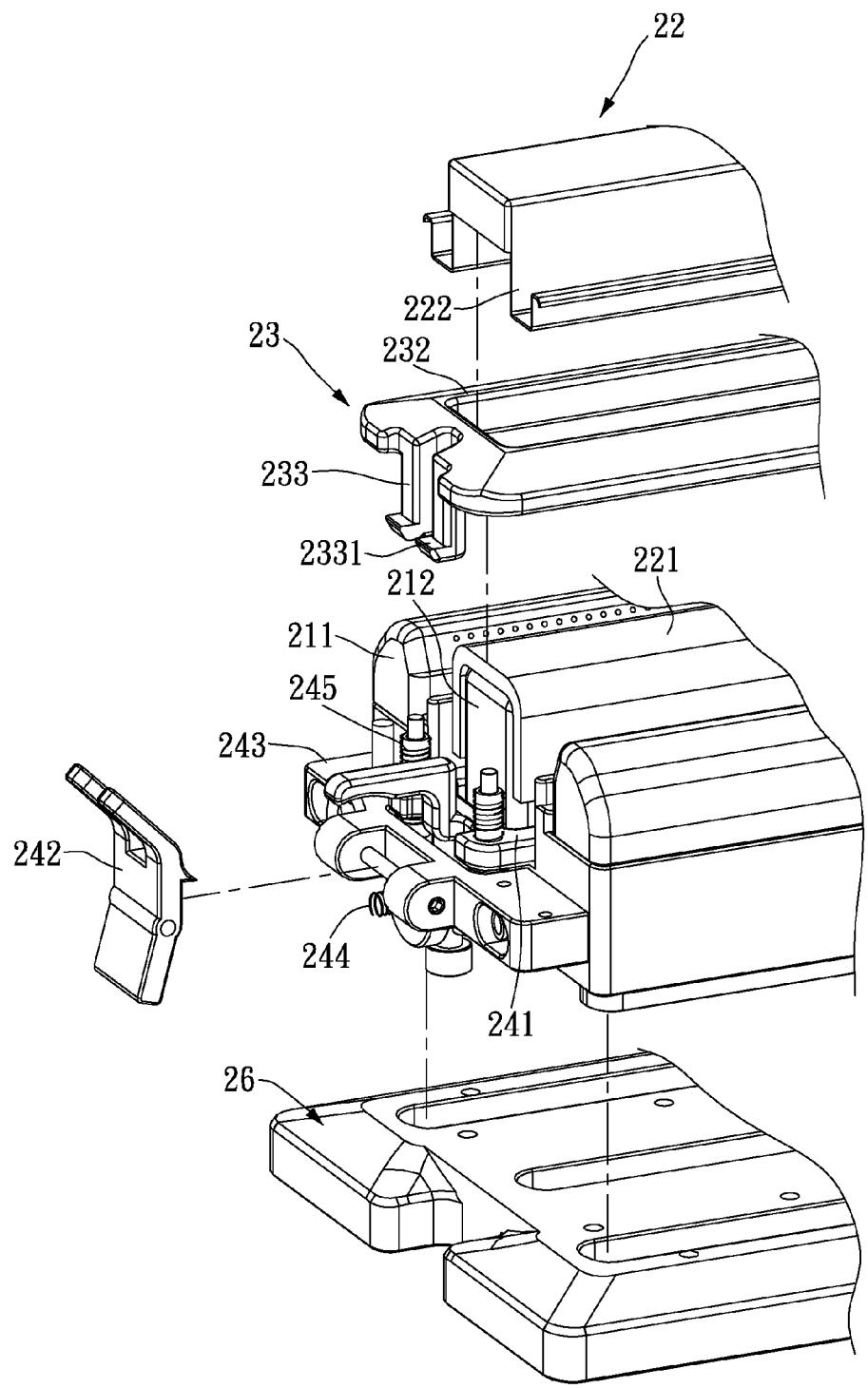
FIG. 4 is an exploded view of the photomask cleaning system illustrating the cleansing device according to the instant disclosure.
Figure 5:
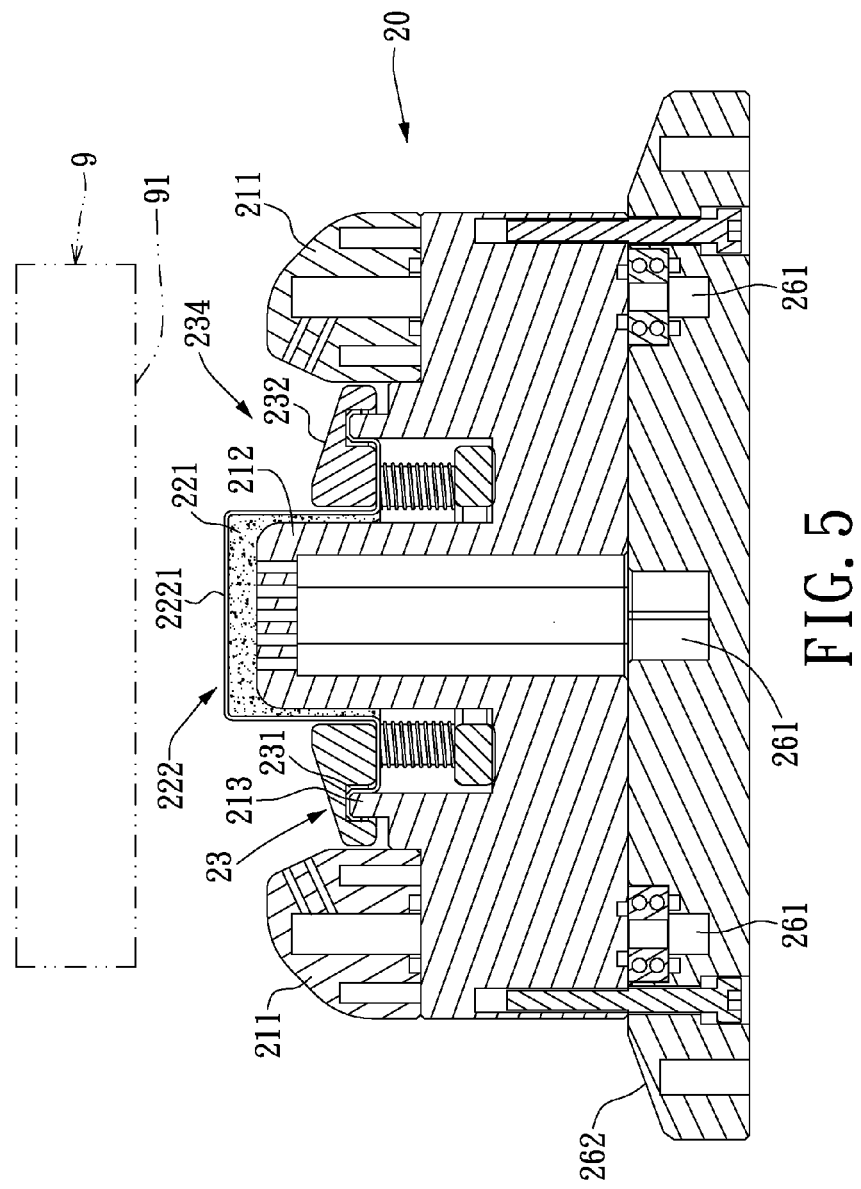
FIG. 5 is a cross-sectional view of the photomask cleaning system illustrating the cleansing device according to the instant disclosure.
Figure 7:
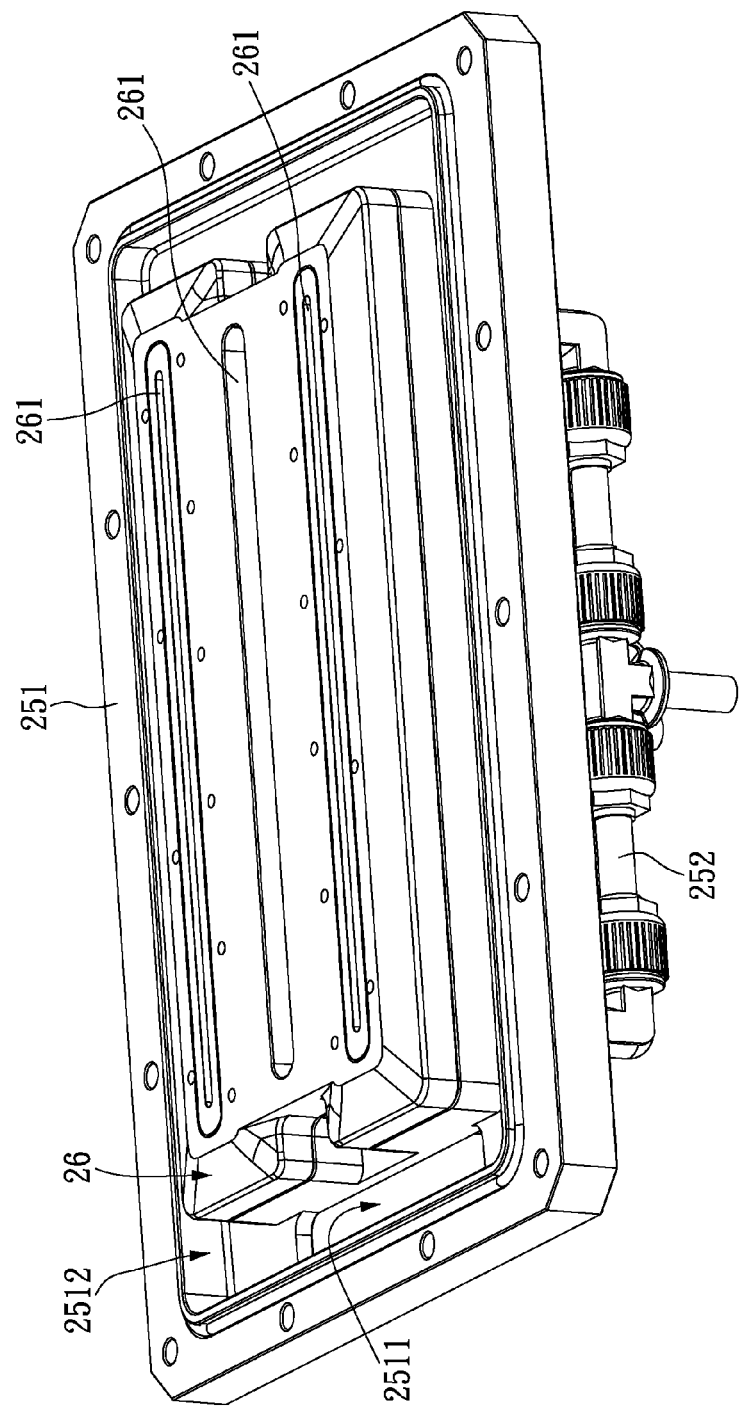
FIG. 7 is a schematic diagram of the photomask cleaning system illustrating the stage and the guiding base according to the instant disclosure.

As shown in FIG. 3, the guiding base 26 is disposed on a side of the retaining plate 251 which is opposite to a plurality of fluid supplying conduits 252. As illustrated in FIGS. 4 and 7, the guiding base 26 includes a plurality of guiding channels 261 which are arranged in parallel with predetermined intervals therebetween, and correspondingly arranged with fluid conduit 252 such that fluids can supply therethrough. The guiding base 26 includes an oblique surface 262 slanted from the center down towards the retaining plate 251 (as shown in FIG. 5) such that fluids (water or cleaning fluids) flow towards the retaining plate 251. The guiding base 26 provides a predetermined distance between the fluid dispensing unit 10 and the retaining plate 251 which prevents the fluid dispensing unit 10 from being flooded with dispensed fluids, and fluids from post-cleaning process, thereby preventing contaminants from backwashing and re-contaminating the photomask 9.

Moreover, a cross-sectional view of the cleansing device 20 is illustrated in FIG. 5. The fluid dispensing unit 21 includes two oblique dispensers 211 arranged on two sides thereof, a direct dispenser 212 arranged between the two oblique dispensers 211, and two ridges 213. The oblique dispensers 211 and direct dispenser 212 are arranged correspondingly with the guiding channels 261. Two ridges 213 are separately arranged on a side of the oblique dispensers 211 facing the direct dispenser 212. In other words, two ridges 213 are disposed on two sides of the direct dispenser 212. The quantity of the oblique dispensers 211 and the direct dispenser 212 are not limited to the examples of the embodiment provided therein. Moreover, the scrubbing unit 22 is disposed on the direct dispenser 212. The scrubbing unit 22 includes a scrubbing sheet 222 and a resilient member 221 which is disposed between the scrubbing sheet 222 and the direct dispenser 212. Through the soft and compressible properties of the resilient member 221, the scrubbing sheet 222 can softly scrubs the photomask 9, and prevent damages on photomask 9 cause by harsh scrubbing.

The direct dispenser 212 can be selected from a fluid dispensing nozzle or a plurality of dispensing openings but not limited thereto. The direct dispenser 212 directly dispenses fluids from a top surface thereof in the general direction of the photomask 9. The top surface of the direct dispenser 212 is capped by the scrubbing unit 22 to allow fluids dispensed from the direct dispenser 212 to completely saturate the scrubbing unit 22 in the duration of the cleaning process, as saturated scrubbing unit 22 is less prone to leave scratches on photomasks compared to unsaturated scrubbing unit 22. The direct dispenser 212 is disposed closer to the photomask 9 compared to the oblique dispensers 211 so as to prevent the oblique dispensers 211 to make contact with and form scratches on the photomask 9 during cleaning. The scrubbing unit 22 further includes in this embodiment a scrubbing surface 2221 which is defined as the portion making contact with the target surface 91.

The oblique dispensers 211 dispense fluids in an oblique direction towards the photomask 9 such that fluids are obliquely dispensed into a contact region between the scrubbing unit 22 and the photomask 9, and towards the peripheries of the scrubbing surface 2221. When fluid flow is obliquely dispensed onto the photomask 9, fluids can permeate between particles and the photomask 9, thereby separating particles from the photomask 9 and facilitating particle removal by fluid flow. With the configuration of the scrubbing unit 22 and oblique dispensers 211, particles are loosened by the scrubbing unit 22 and removed by the obliquely dispensed fluid flow. The oblique dispensers 211 can be selected from a fluid dispensing nozzle or a plurality of dispensing openings but not limited thereto.

As illustrated in FIGS. 3 and 5, the cover 23 is disposed on the direct dispenser 212 configured to allow exposure thereof. A portion of the scrubbing unit 22 is disposed between the fluid dispensing unit 21 and the cover 23 and substantially caps the direct dispenser 212. The cover 23 includes an oblique surface 232 formed thereon which slants towards the retaining plate 251 for fluids to flow therein. In other words, the oblique surface 232 is disposed proximate to the peripheries of the scrubbing surface 2221. The oblique surface 232 is configured to form a channeling region 234 to facilitate fluids after cleaning the photomask 9 to smoothly flow through the channeling region 234, the oblique surface 232, and into the retaining plate 251. The cover 23 is disposed proximate to the oblique dispensers 211 with a predetermined distance therebetween to facilitate draining. As shown in FIG. 4, the cover 23 further includes a fixing arm 233 extending along two ends thereof. The fixing arm 233 includes a slot 2332 and a lip 2331 formed on an end of the fixing arm 233 and is arranged parallel to the retaining plate 251.

Referring to FIG. 5, the cover 23 further includes two grooves 231 correspondingly conform to the two ridges 213 for securing portions of the scrubbing sheet 222 therebetween and the scrubbing sheet 222 on the direct dispenser 12. When the scrubbing sheet 222 is due for replacement, the cover 23 can be lifted for immediate replacement.

Figure 6:
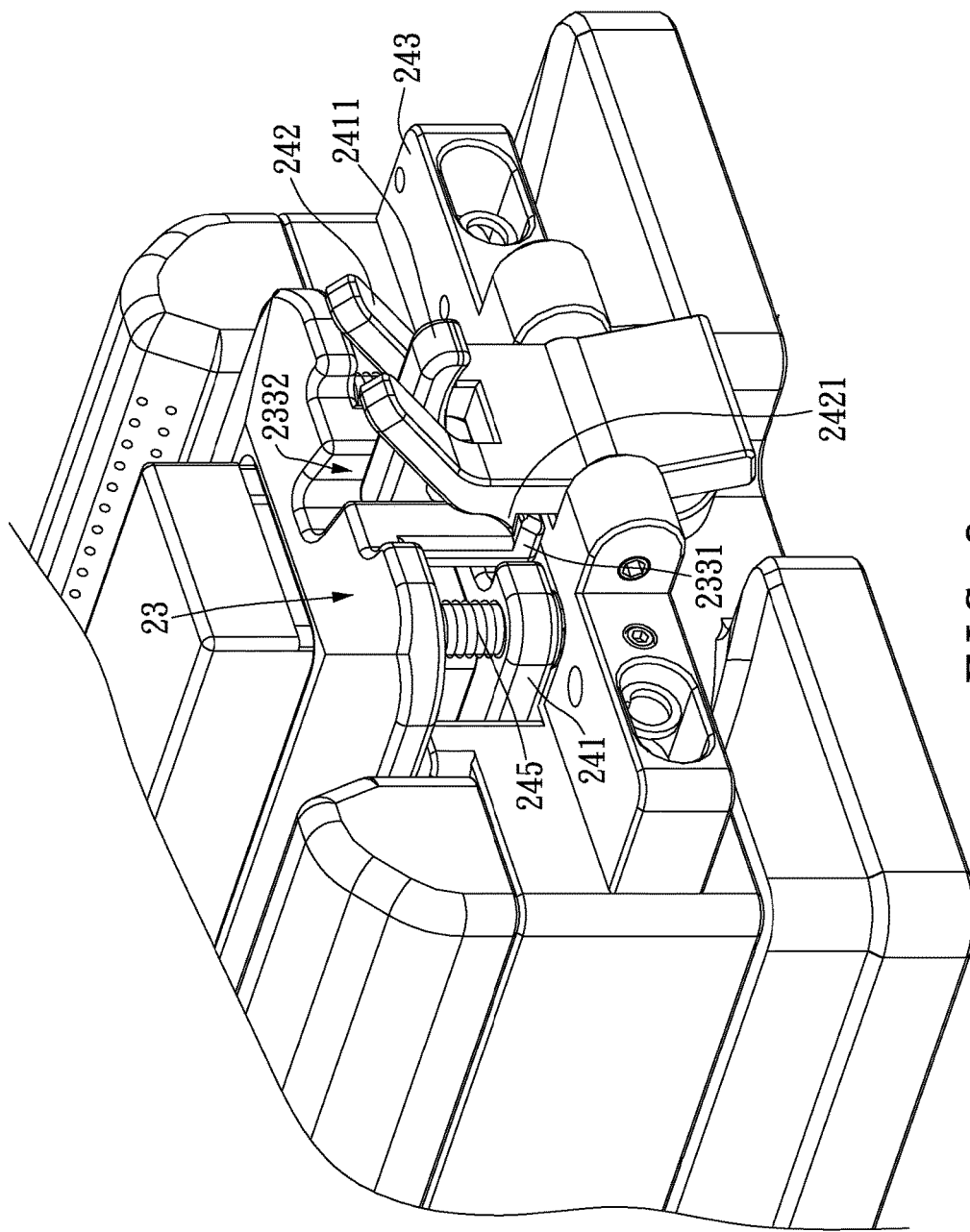
FIG. 6 is a schematic diagram of the photomask cleaning system illustrating the assembled fixing unit according to the instant disclosure.

Referring to FIG. 4 and FIG. 6, the fixing unit 24 includes a base 243, a clipping member 242, a frame 241, a first elastic member 244 and a second elastic member 245. The frame 241 is disposed around the direct dispenser 212 between the cover 23 and the fluid dispensing unit 21, includes a handle 2411 formed on two ends thereof, and glides through the slot 2332. The second elastic member 245 is disposed between the frame 241 and the cover 23 while being in a compression state.

The base 243 is disposed on two ends of the fluid dispensing unit 21, and the clipping member 242 is pivotally coupled to the base 243. The first elastic member 244 is disposed between the base 243 and the clipping member 242. The first elastic member 244 abuts the base 243 at one end while abutting the clipping member 242 at the other end thereof. Moreover, the clipping member 242 includes a shoulder 2421 which abuts the lip 2331 of the fixing arm 233. Since the second elastic member 45 is compressed between the cover 23 and the frame 241, the second elastic member 245 provides an upward force against the cover 23. Due to the compression state of the first elastic member 244, a reaction and opposing force therefrom is applied onto the shoulder 2421 of the clipping member 242, thus rendering the shoulder 2421 to maintain the abutment between the shoulder 2421 and the lip 2331, and thereby securing the cover 23 to the fluid dispensing unit 21 while allowing the cover 23 to be released for facilitating the replacement of the scrubbing unit 22 when a force is applied on a top portion of the shoulder 2421.

Figure 8:
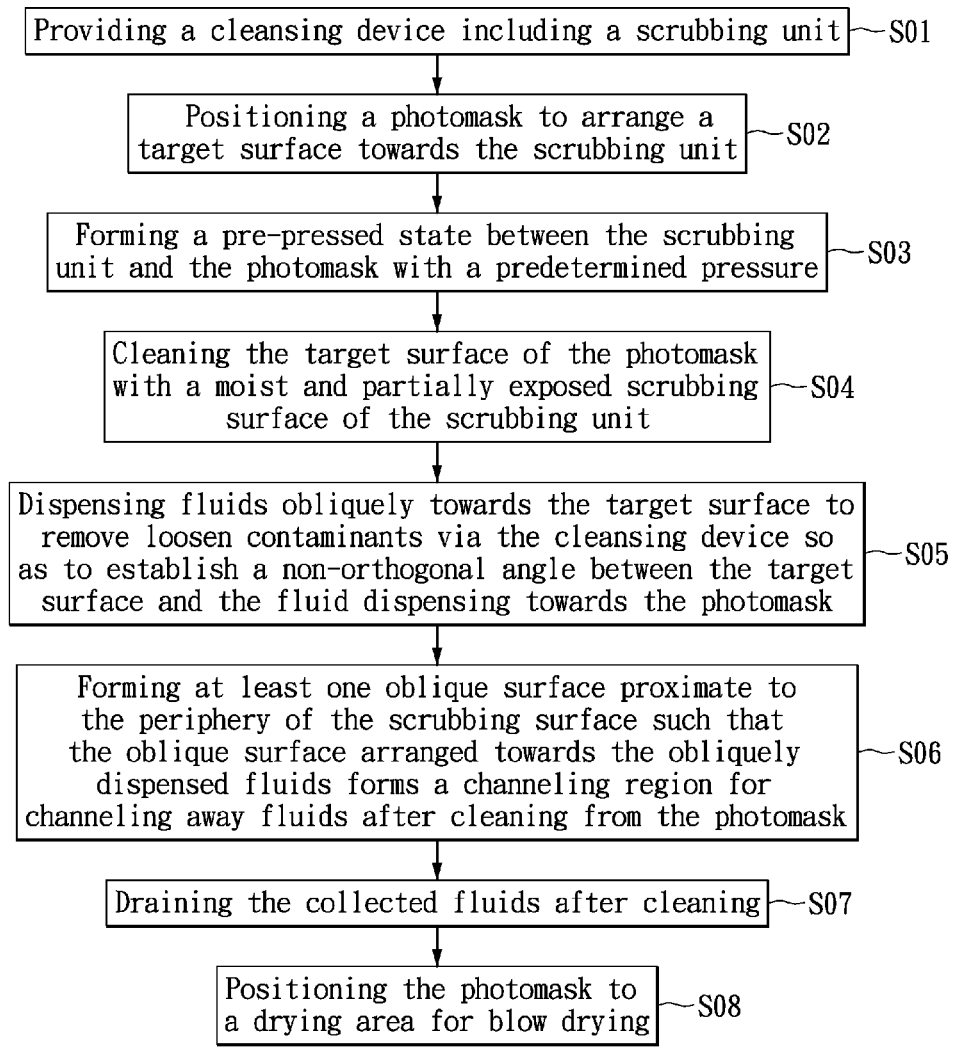
FIG. 8 is a flow chart of the photomask cleaning method according to the instant disclosure.

As illustrated in FIG. 8, a flow chart of the method for the photomask cleaning system 1 is provided, and the description as follow.

Initially, provide the cleansing device 20 having the scrubbing unit 22 which includes the resilient member 212 and the scrubbing sheet 222. The scrubbing sheet 222 is not limited to the examples of the instant embodiments provided therein (Refer to FIGS. 3 and 4).

In regards to securing the scrubbing unit 22, as aforementioned in FIG. 5, the cover 23 can be used to secure the scrubbing unit 22. The cover 23 having a pair of correspondingly conforming concave and convex surface to retain two sides of the scrubbing unit 22 wherein the concave and convex surface retained in the instant embodiment is the scrubbing sheet 222 while not limited thereto (Refer to FIG. 5).

A photomask is retained then mobilized from the receiving area A to the rinsing area B which contains the cleansing device 20 while the target surface 91 is arranged towards the cleansing device 20 (Refer to FIGS. 1 and 2). As the photomask 9 and the scrubbing unit 22 approach one another, a pre-pressed state is formed therebetween with a predetermined pressure. The pre-pressed state can be altered by adjusting the positioning of the cleansing device 20 or the photomask 9.

The partially exposed portion of the scrubbing unit 22 defined as the scrubbing surface 2221 in the instant embodiment is dampened. The scrubbing surface 2221 then approaches and cleans the photomask 9 (Refer to FIG. 5).

The cleansing device 20 then dispenses fluids obliquely towards two sides of the scrubbing surface 2221 to remove loosen contaminants so as to establish a non-orthogonal angle between the target surface 91 of the photomask 9 and the obliquely dispensed fluids.

Moreover, the oblique surface 232 is formed proximate to the peripheries of the scrubbing surface 2221 such that the oblique surface 232 is arranged towards the obliquely dispensed fluids to form a channeling region 234 for channeling away fluids after cleaning from the photomask 9 via the oblique surface 232, and thereby preventing contaminants to backwash (Refer to FIG. 5).

Furthermore, fluids before and after cleaning are then collected and drained. The cleansing device 20 in the instant embodiment includes a retaining plate 251 for collecting such fluids.

Successively, the retaining device 10 mobilizes the photomask 9 to a drying area C for blow drying (Refer to FIG. 1), and subsequently returns the photomask 9 to the receiving area A (Refer to FIG. 2).

In summary, with the configuration of the oblique dispenser 211 and the scrubbing unit 22, particles on photomasks are obliquely rinsed and removed through fluid flow, thus providing relatively cleaned photomasks. Moreover, with the oblique surfaces 232, 262 of the cover 23 and guiding base 26, clean or contaminated fluids can be smoothly drained and removed away from the photomask 9 thereby preventing the photomask from re-contamination.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. A photomask cleaning method for cleaning a photomask including a target surface, comprising steps of:

providing a cleansing device including a scrubbing unit;

positioning a retained photomask for arranging a target surface thereof towards the scrubbing unit;

forming a pre-pressed state between the scrubbing unit and the photomask with a predetermined pressure;

cleaning the target surface of the photomask with a moist and partially exposed scrubbing surface of the scrubbing unit;

dispensing fluids obliquely towards the target surface to remove loosen contaminants via the cleansing device so as to establish a non-orthogonal angle between the target surface and the fluid dispensing towards the photomask, the dispensing fluids dispensed from two oblique dispensers arranged on two sides of the scrubbing unit;

forming at least one oblique surface under the obliquely dispensed fluids and facing the target surface, the at least one oblique surface arranged between the scrubbing unit and the two dispensers and surrounding the scrubbing unit and proximate the scrubbing surface, the at least one oblique surface having an inner portion adjacent to the scrubbing unit and an outer portion away from the scrubbing unit, the inner portion approximating the target surface and the outer portion being away from the target surface, such that the at least one oblique surface arranged inclined to the target surface and towards the obliquely dispensed fluids forms a channeling region for channeling away fluids after cleaning from the photomask;

draining the collected fluids after cleaning; and positioning the photomask to a drying area for blow drying.

2. The method as recited in claim 1, wherein the obliquely dispensed fluids are dispensed towards two sides of the scrubbing surface.

3. The method as recited in claim 1, further comprising the step of: adjusting the positioning of scrubbing device to form the pre-pressed state.

4. The method as recited in claim 1, further comprising the step of: adjusting the positioning of the photomask to form the pre-pressed state.

5. The method as recited in claim 1, further comprising the step of: providing a cover securely retaining two sides of the scrubbing unit.

6. The method as recited in claim 5, wherein the two sides of the scrubbing unit are retained by a pair of correspondingly conforming concave and convex surfaces.

7. The method as recited in claim 5, wherein the scrubbing unit disposed on a direct dispenser by the cover, the scrubbing unit includes a scrubbing sheet and a resilient member which is disposed between the scrubbing sheet and the direct dispenser.

* * * * *